(12) United States Patent
Chow et al.

(10) Patent No.: US 8,159,024 B2
(45) Date of Patent: Apr. 17, 2012

(54) HIGH VOLTAGE (>100V) LATERAL TRENCH POWER MOSFET WITH LOW SPECIFIC-ON-RESISTANCE

(75) Inventors: Tat-sing Paul Chow, Niskayuna, NY (US); Kamal Raj Varadarajan, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 190 days.

(21) Appl. No.: 12/596,593

(22) PCT Filed: Apr. 20, 2008

(86) PCT No.: PCT/US2008/005119
§ 371 (c)(1),
(2), (4) Date: Mar. 10, 2010

(87) PCT Pub. No.: WO2008/130691
PCT Pub. Date: Oct. 30, 2008

(65) Prior Publication Data
US 2010/0163988 A1 Jul. 1, 2010

Related U.S. Application Data

(60) Provisional application No. 60/925,633, filed on Apr. 20, 2007.

(51) Int. Cl.
*H01L 29/78* (2006.01)
*H01L 21/336* (2006.01)

(52) U.S. Cl. ........ 257/330; 257/386; 257/409; 257/488; 257/E29.118; 257/E29.257; 257/E21.418; 257/E21.629; 438/268; 438/269; 438/270; 438/273

(58) Field of Classification Search ............... 257/330, 257/386, 409, 488, E29.118, E29.257, E21.418, 257/E21.629; 438/268, 269, 270, 273
See application file for complete search history.

(56) References Cited

U.S. PATENT DOCUMENTS

| | | | | |
|---|---|---|---|---|
| 5,640,034 A | * | 6/1997 | Malhi | 257/341 |
| 5,723,891 A | * | 3/1998 | Malhi | 257/341 |
| 5,895,951 A | * | 4/1999 | So et al. | 257/330 |
| 6,750,105 B2 | | 6/2004 | Disney | |
| 6,861,702 B2 | | 3/2005 | Kitamura | |
| 7,033,889 B2 | * | 4/2006 | Hijzen et al. | 438/259 |
| 7,132,344 B1 | | 11/2006 | Knorr | |
| 7,408,223 B2 | * | 8/2008 | Hueting | 257/328 |

(Continued)

OTHER PUBLICATIONS

Appels and Vaes, "High-voltage thin layer devices (RESURF devices)," *IEDM Tech Dig* pp. 238-241 (1979).

(Continued)

*Primary Examiner* — Evan Pert
(74) *Attorney, Agent, or Firm* — Wolf, Greenfield & Sacks, P.C.

(57) ABSTRACT

In one aspect, a lateral MOS device is provided. The lateral MOS device includes a gate electrode disposed at least partially in a gate trench to apply a voltage to a channel region, and a drain electrode spaced from the gate electrode, and in electrical communication with a drift region having a boundary with a lower end of the channel region. The device includes a gate dielectric layer in contact with the gate electrode, and disposed between the gate electrode and the drain electrode. The channel region is adjacent to a substantially vertical wall of the gate trench. The device includes a field plate contacting the gate electrode and configured to increase a breakdown voltage of the device.

14 Claims, 8 Drawing Sheets

U.S. PATENT DOCUMENTS

2007/0032029 A1 2/2007 Chow et al.
2008/0179672 A1* 7/2008 Hirler et al. .................. 257/342
2010/0244125 A1* 9/2010 Sonsky et al. ................. 257/330

OTHER PUBLICATIONS

Murari et al. (eds.), *Smart Power ICS, Technologies and Applications*, Table of Contents, Springer-Verlag, Berlin 1996.

Fujishima and Salama, "A trench lateral power MOSFET using self-aligned trench bottom contact holes," *IEDM Tech Dig* pp. 359-362 (1997).

International Search Report and Written Opinion for International Application Serial No. PCT/US2008/005119 mailed Oct. 15, 2009.

Varadarajan and Chow, "Low Voltage (30V-80V) Lateral Trench Power MOSFETs for High Frequency DC/DC Converter Applications," *Proceedings 2004 Annual Power Electronics Seminar at Virginia Tech*, Apr. 18-20, 2004, Blacksburg, Virginia, CPES Power Electronics Systems pp. 176-178.

Varadarajan et al., "Novel Integrable 80V Silicon Lateral Trench Power MOSFETS for High Frequency DC-DC Converters," Power Electronics Specialists Conference, Jun. 17-21, 2007, Orlando, Florida, pp. 1013-1017.

Varadarajan et al., "250V Integrable Silicon Lateral Trench Power MOSFETs with Superior Specific On-Resistance," Proceedings of the 19th International Symposium on Power Semiconductor Devices & ICs, May 27-30, 2007, Jeju, Korea.

* cited by examiner

HIGH VOLTAGE (>100V) LATERAL TRENCH POWER MOSFET WITH LOW SPECIFIC-ON-RESISTANCE

RELATED APPLICATION

This application is a national stage application under 35 U.S.C. §371 of International Application Ser. No. PCT/US2008/005119 filed Apr. 20, 2008 and entitled "A High Voltage (>100 V) Lateral Trench Power MOSFET with Low Specific-on-resistance," which claims priority to U.S. Provisional Application Ser. No. 60/925,633, entitled "A High Voltage (>100V) Lateral Trench Power MOSFET with Low Specific-on-resistance," filed on Apr. 20, 2007, both of which are herein incorporated by reference in their entirety.

FEDERALLY SPONSORED RESEARCH

This invention was made with Government support under NSF-ERC Contract No. EEC-9731677. The Government has certain rights to this invention.

FIELD OF INVENTION

The invention is related to semiconductor device structures and fabrication methods, and, more particularly, to power devices and their fabrication.

BACKGROUND OF INVENTION

Lateral power metal-oxide semiconductor field-effect transistors (MOSFETs) are valuable components in many power circuits, for example, in those that are included in portable power management products, personal computer peripherals, and automotive devices. The benefit of lateral power MOSFETs include generally high switching speeds and a relatively low on-resistance.

Improvements to packing density and on-resistance have been achieved by implementing a lateral MOSFET with a trench that has a gate, channel, and drift region along a sidewall of the trench. A lateral trench MOSFET, referred to as a trench-type lateral MOSFET, can provide a significant reduction in a lateral dimension, such as a cell pitch, in comparison to a non-trench-based lateral MOSFET. This reduction in cell pitch tends to lower the on-resistance of the transistor.

FIGS. 1A and 1B illustrate conventional trench-type lateral MOSFETS. The chief difference between the MOSFETS in FIGS. 1A and 1B is that an n-drift region is implanted in FIG. 1A and is formed from an epitaxial layer in FIG. 1B. The operation of the devices is substantially the same and will be described coincidentally. In particular, the MOSFETS in FIGS. 1A and 1B include a gate, channel, and a drift region (e.g., n-drain region in FIGS. 1A and n-epi layer in FIG. 1B) formed along a sidewall of a trench, and a source region adjacent to the channel and in contact with a surface-located source contact. Current flow through the channel can proceed from the source contact at the surface of the device, through the channel, to drift and drain regions at the bottom of the trench, and into a drain electrode residing in the trench along with the gate.

When in a blocking mode, the drift region can sustain a portion of an applied voltage. Structural dimensions and doping levels of portions of a lateral trench MOSFET can be selected to provide a particular breakdown voltage. For example, the trench depth can be increased to increase breakdown voltage.

In contrast to a lateral trench MOSFET, a vertical trench MOSFET can have a vertically disposed drain, with a drain contact on a backside of a die. A lateral trench MOSFET, however, has all terminal connections available at the top surface of a die, and typically can be more readily integrated with other components in an integrated circuit.

SUMMARY

One embodiment according to the present invention includes a lateral MOS device comprising a gate electrode disposed at least partially in a gate trench for applying a voltage to a channel region adjacent to a substantially vertical wall of the gate trench, a drain electrode in electrical communication with a drift region having a boundary with a lower end of the channel region, and a gate dielectric layer in contact with the gate electrode, and disposed between the gate electrode and the drain electrode.

Another embodiment according to the present invention includes a power integrated circuit. The power integrated circuit includes a lateral transistor, comprising a gate electrode disposed at least partially in a gate trench for applying a voltage to a channel region adjacent to a substantially vertical wall of the gate trench, a drain electrode in electrical communication with a drift region having a boundary with a lower end of the channel region, and a gate dielectric layer in contact with the gate electrode, and disposed between the gate electrode and the drain electrode.

Another embodiment according to the present invention includes a lateral MOS device, comprising a gate electrode disposed at least partially in a gate trench for applying a voltage to a channel region adjacent to a substantially vertical wall of the gate trench, and a drain electrode in electrical communication with a drift region having a boundary with a lower end of the channel region, wherein the drain electrode is at least partially disposed in a drain trench laterally spaced from the gate trench.

According to another aspect, an apparatus is provided comprising a semiconductor substrate, and an epitaxial layer disposed on the semiconductor substrate and configured to provide a drift region. The apparatus further comprises a body portion contacting the drift region and configured to provide a channel for current flow when a bias signal is applied to a gate electrode. A source region contacts the body portion. A gate trench is formed in the epitaxial layer. The gate electrode is formed at least partially in the gate trench and extends to a first depth in the gate trench. The apparatus further comprises a field plate formed at least partially in the gate trench and extending to a second depth, greater than the first depth, in the gate trench. The apparatus further comprises a dielectric material comprising a first portion disposed in the gate trench between the gate electrode and the source region and a second portion disposed in the gate trench between the field plate and the epitaxial layer.

According to another aspect, a method of manufacturing a lateral trench-based device is provided. The method comprises forming an epitaxial layer on a semiconductor substrate, forming a gate trench in the epitaxial layer, and filling at least a portion of the gate trench with a dielectric material. The method further comprises forming a gate electrode in the dielectric material, the gate electrode extending to a first depth in the gate trench, and forming a field plate in the dielectric material, the field plate extending to a second depth, greater than the first depth, in the gate trench.

BRIEF DESCRIPTION OF DRAWINGS

The accompanying drawings, are not intended to be drawn to scale. For purposes of clarity, not every component may be labeled in every drawing. In the drawings.

DETAILED DESCRIPTION

Conventional lateral trench-based components, such as trench lateral transistors (also referred to as trench-type lateral transistors), typically have a substantial undesirable capacitance related to the overlap of gate and drain electrodes in the same trench. In particular, many trench-type lateral transistors are fabricated with the gate and the drain formed in the same trench, typically separated by an oxide layer. The overlap of the gate and drain regions results in a parasitic gate-to-drain capacitance. This capacitance can damage frequency response.

Figure 1A:
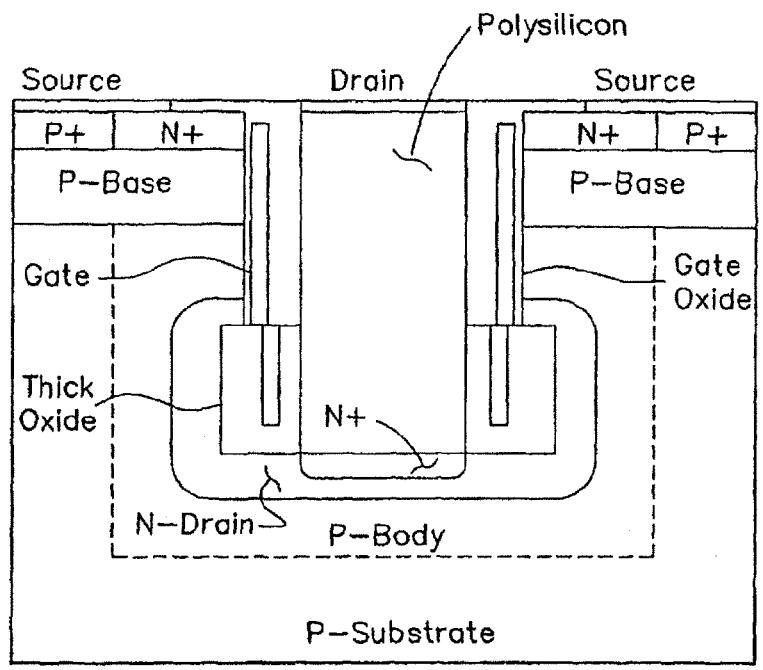
FIGS. 1A and 1B illustrate a conventional trench-type lateral MOS transistor.
Figure 1B:
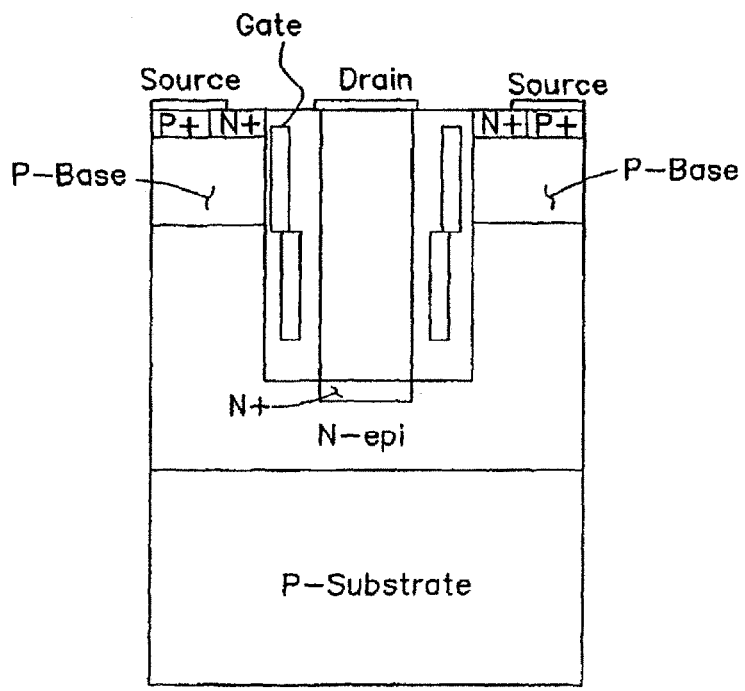

For example, in the MOSFETS illustrated in FIGS. 1A and 1B, the gate and drain are formed in the same trench, causing substantial overlap that results in generally deleterious gate-to-drain capacitance. The gate-to-drain capacitance increases the charge required at the gate to turn the transistor on, which, in turn, may negatively impact switching speeds. Moreover, to achieve higher blocking or breakdown voltages, the depth of the trench in which the gate and the drain are formed is often increased. However, the increased trench depth tends to increase the overlap of the gate and the drain, which may exacerbate this problem, increasing the parasitic capacitance between gate and drain electrodes.

It may be desirable to provide lateral trench-based components having other beneficial operating characteristics. For example, it may be desirable to provide components having a high breakdown voltage, as well as having low specific-on-resistance. These and other benefits may be achieved using the structures and methods described herein, according to various aspects of Applicants' invention.

Some aspects of the present invention derive from Applicants' realization that the capacitance arising from the overlap of gate and drain electrodes in a conventional lateral trench component can be reduced by laterally shifting a location of a drain electrode relative to a gate electrode. For example, rather than placing both source and drain electrodes in the same trench, the electrodes can reside in different trenches. Moreover, a drift region can electrically link a drain region, in contact with a drain electrode in one trench, to a channel region adjacent to a gate electrode in a second trench. Some aspects also derive from Applicants' appreciation that the breakdown voltage of lateral trench-based components, such as trench-based transistors, may be increased by a field plate.

Following below are more detailed descriptions of various concepts related to, and embodiments of, methods and apparatus according to the present invention. It should be appreciated that various aspects of the invention described herein may be implemented in any of numerous ways. Examples of specific implementations are provided herein for illustrative purposes only.

Figure 2:
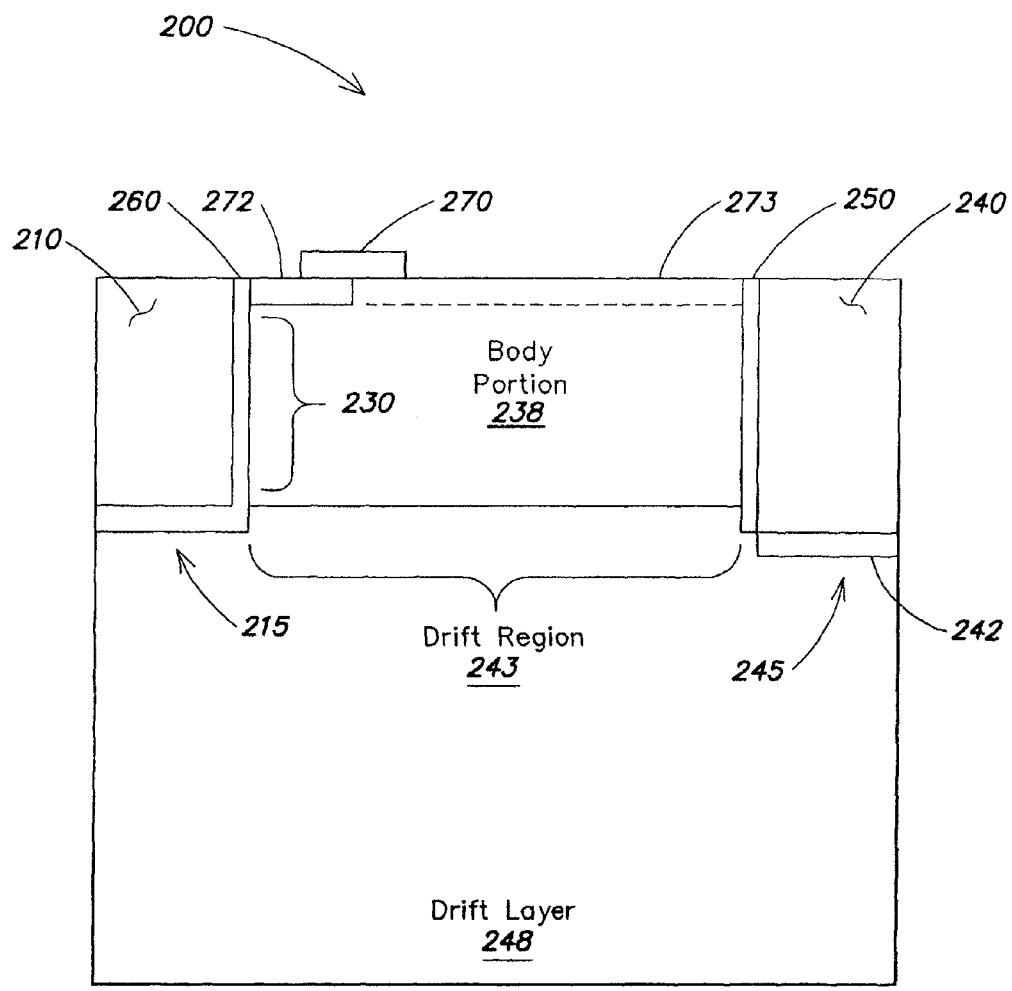
FIG. 2 is a cross-sectional diagram of a portion of a lateral MOS device, in accordance with one embodiment of the invention.

FIG. 2 is a cross-sectional diagram of a portion of a lateral MOS device 200, according to one embodiment of the invention. The device 200 can be, for example, a transistor or another device that may utilize trench technology, and/or operate as a power, switch and/or logic device. The device 200 includes a drift layer 248, and a body portion 238 disposed on the drift layer 248. The drift layer 248 supports a drift region 243, and the body portion 238 supports a channel region 230. The device 200 also includes a gate electrode 210 and a drain electrode 240 that are laterally spaced from each other, and respectively reside in a gate trench 215 and a drain trench 245.

The device further includes a gate dielectric layer 260 in contact with the gate electrode 210 and disposed between the gate electrode 210 and the channel region 230 and between the gate electrode 210 and the drift layer 248, to isolate the gate electrode within the trench. The device further includes a dielectric layer 250 formed between the drain electrode 240 and body portion 238. A source of the device is disposed laterally between the gate and drain trenches, comprising a source region 272, a source electrode 270 in contact with the source region 272, and a heavily doped extension 273 of the body portion 238, formed adjacent to the source region 272. A drain region 242 is disposed in electrical communication with the drift region 243.

The channel region 230 is substantially vertically oriented, and is mediated by a voltage applied to the gate electrode 210. The drift region 243 provides a current pathway between the drain region 242 and an end of the channel region 230 near the bottom of the gate trench 215. The device 200 may be implemented as, for example, a transistor, one embodiment of which is described below with reference to FIG. 3.

At least a portion of the body portion 238 is formed of a semiconductor material to provide the channel region 230. Similarly, at least a portion of the drift layer 248 is formed of a semiconductor material to provide the drift region 243. The body portion 238 and the drift layer 248 have opposite doping types, i.e., one is n-type doped while the other is p-type doped.

The drain region 245 is formed of a semiconductor having the same doping type as the drift layer 248, although drain region 245 may have a higher dopant concentration. Moreover, the drain region 245 can be formed in the drift region by addition of dopant to a portion of the drift layer 248. Similarly, the source region 272 is formed of a semiconductor having a same dopant type as the body portion 238, though source region 275 may have a higher dopant concentration. The gate and drain electrodes 210, 240 are formed of conductors such as metallic materials or heavily doped semiconductor materials. A source-drain capacitance, arising in part from the interaction between the source electrode 210 and the drain electrode 240, is preferably small relative to some conventional semiconductor-based components, due to the spacing between the electrodes 210, 240. In contrast to some conventional devices, the gate dielectric layer 260 resides between the gate electrode 210 and the drain electrode 240.

Due to the lateral spacing between gate and drain electrodes, the parasitic gate-to-drain capacitance arising in conventional trench-type lateral devices may be reduced and/or eliminated. As a result, the charge at the gate necessary to turn on the device is substantially reduced, facilitating higher switching speeds and increased linearity of the device, as described in further detail below. It should be appreciated that the regions of device 200 may be formed in any dimension, and the relative dimensions of the various regions illustrated in FIG. 2 are merely exemplary. For example, the trenches containing the gate and drain electrodes may be of any dimension, and may be of a same or different depth, width, etc., as the aspects of the invention are not limited in this respect.

Figure 3:
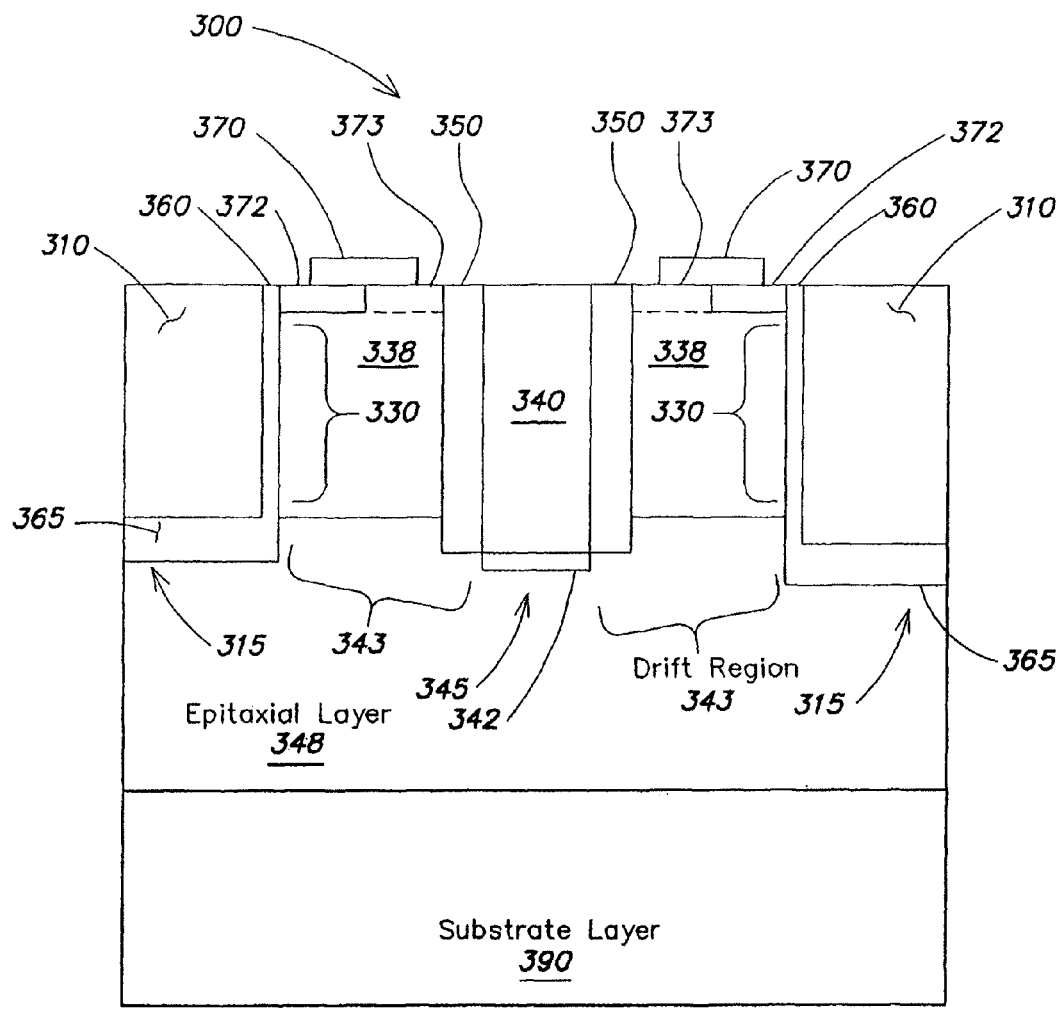
FIG. 3 is a cross-sectional diagram of a portion of a lateral MOS transistor, in accordance with one embodiment of the invention.

FIG. 3 is a cross-sectional diagram of a portion of a lateral MOS transistor 300, in accordance with one embodiment of the invention. It should be appreciated that device 300 is a lateral device in the sense that electrical connections to both source and drain regions are made from the top side of a wafer die within which the device 300 resides. In contrast, a vertical MOS transistor would typically make contact to a drain region via the backside of a wafer die. Lateral MOS transistor 300 includes a gate electrode 310, a gate dielectric layer 360, a body portion 338 supporting a channel region 330, source and drain regions 372, 342, respectively, in electrical communication with opposite ends of the channel region 330.

Lateral MOS transistor 300 also includes a source electrode 370 in contact with the source region 372, a drain electrode 340 in contact with the drain region 342, an insulating layer 350 adjacent to sides of the drain electrode 340, and an epitaxial layer 348 supporting a drift region 343 that electrically links the drain region 342 to the channel region 330. The transistor 300 can also include a relatively heavily doped extension 373 of the body portion 338, adjacent to the source region 372. A heavily doped extension 373 can suppress the turn-on of a parasitic transistor that is inherent in the structure of the transistor 300.

The gate electrode 310 is disposed in a gate trench 315. The gate electrode 310 is used to apply a gate voltage to mediate current flowing between the source region 372 and the drift region 343 through the channel region 330. The gate dielectric layer 360 is in contact with the gate electrode 310, and is disposed between the gate electrode 310 and the channel region 330. The channel region 330 is in turn disposed between the gate dielectric layer 360 and the drain electrode 340. The gate dielectric layer 360 has a substantially vertical orientation. This vertical orientation can provide a smaller device lateral footprint for the transistor.

The drain electrode 340 is disposed in a drain trench 345, and is laterally spaced from the gate trench 315. The spacing between the drain electrode 340 and the gate electrode 310 effectively eliminates overlap between the drain electrode 340 and the gate electrode 310, thus leading to a reduction in the associated parasitic capacitance. In particular, rather than having both the gate and drain terminals formed within the same trench, the structure in FIG. 3 allows the gate and drain to be decoupled using the two trenches separated by the mesa region forming the source.

During operation of the transistor 300, when a positive bias voltage greater than the threshold voltage of the transistor 300 is applied to the gate electrode 310, an inversion layer of electrons forms in the channel region 330, adjacent to the trench sidewall. Electrons flow from the n+ doped source region 372, through the channel region 330 and the epitaxial layer 348 based drift region 343, to the n+ doped drain region 342, and are collected by the drain electrode 340.

The transistor 300 supports voltages across both the channel region 330 and the drift region 343. The voltage supported across the drift region 343 can be viewed, in this example, as having both a vertical component and a lateral (horizontal) component. The vertical component is associated with a portion of the epitaxial layer 348 that extends from the channel region 330 through a portion of the drift region 343 to the bottom of the gate trench 315, and the horizontal component is associated with a portion of the epitaxial layer 348 that extends from the edge of the gate trench 315 to the drain region 342. Accordingly, transistor 300 benefits from advantages of both lateral and vertical transistor technology.

A blocking voltage of the transistor 300 can be increased by increasing the length of the horizontal component of the drift region. For example, the lateral thickness of the insulating layer 350 can be increased to move the drain electrode 340 further from the gate electrode 310, to provide a greater blocking voltage. Since it can be desirable to have shallow trenches 315, 345, the horizontal component can be increased to preserve a suitable blocking voltage. That is, the thickness of insulating layer (e.g., an oxide layer) can be varied to achieve a desired breakdown voltage without having to form deeper trenches.

As discussed above, the parasitic gate-to-drain capacitance may be reduced and/or eliminated by decoupling the gate from the drain by providing separate trenches. However, such a transistor may still have a relatively small parasitic capacitance associated with the overlap of the drift region 343 and the gate electrode 310. However, this parasitic capacitance may be reduced and/or eliminated by providing a thicker insulating layer at the bottom of the trench containing the gate electrode than along the sides of the trench, as shown by the increased thickness of the dielectric layer 365 relative to the dielectric layer 360. This additional dielectric thickness provides an improvement in the parasitic capacitance over the structure illustrated in FIG. 2.

Because the gate and drain overlap substantially controls the parasitic gate-to-drain capacitance, this parasitic capacitance may remain substantially constant as the blocking voltage of the transistor is increased by, for example, increasing the lateral drift distance and/or increasing the thickness of the insulation layer between the drain electrode and the mesa region that forms the source. Thus, the blocking voltage can be scaled up without increasing the gate-to-drain capacitance. That is, a desired breakdown voltage may be achieved both without forming deeper trenches, and without increasing the gate-to-drain capacitance, as discussed in further detail below.

Figure 4A:
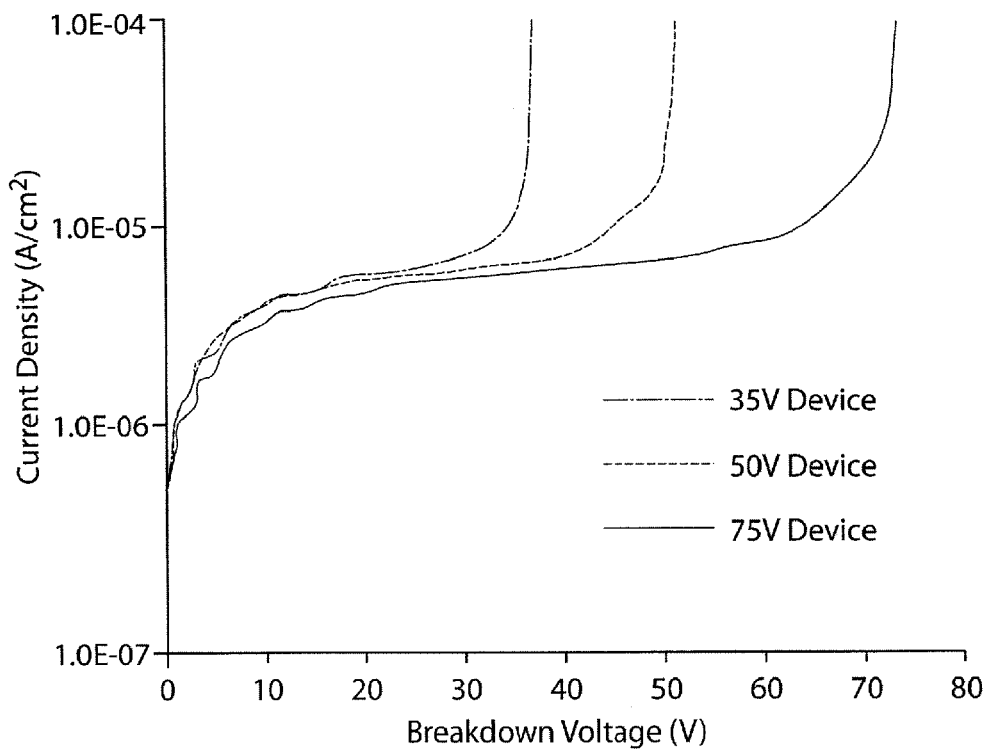
FIGS. 4A and 4B illustrate plots showing the improved charge characteristics of transistors formed in accordance with various aspects of the invention.

For example, as discussed above, increased gate-to-drain capacitance increases the charge at the gate necessary to turn on the transistor. FIG. 4A illustrates a plot of voltage versus current density for several embodiments of a trench-type lateral transistor having a structure similar to transistor 300 illustrated in FIG. 3. In particular, the three curves resulted from using transistors having a 2 μm n-type epitaxial layer with a $10^{-16}/cm^3$ doping level disposed on a p-type substrate with a $10^{-15}/cm^3$ doping level. The trench depths for each device were fixed at 1 μm. The insulating layer between the drain electrode and the source mesa was formed as an oxide layer that was varied in thickness depending on a desired breakdown voltage of the device. Specifically, the thickness of the oxide layer was varied from 0.5 μm for the 35V breakdown voltage device to 2 μm for the 75V breakdown voltage device.

Figure 4B:
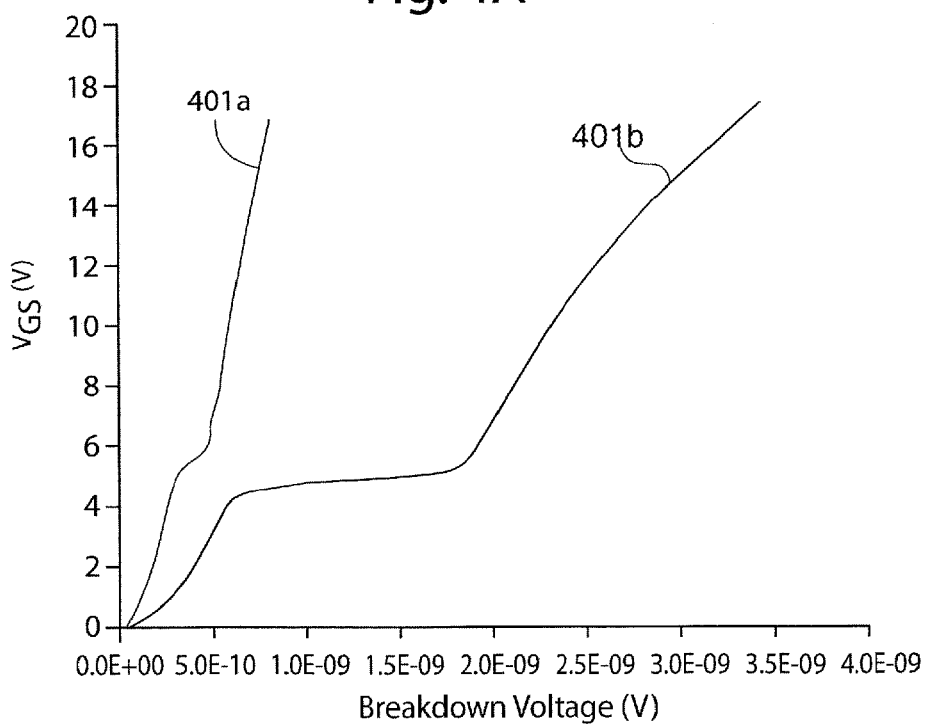

As shown in FIG. 4A, the current density (which depends, at least in part, on the parasitic gate-to-drain capacitance) does not substantially increase with breakdown voltage. Accordingly, the oxide layer may be used as a design parameter to achieve a desired breakdown voltage without increasing in the parasitic capacitance, and consequently, without increasing the charge required to turn the transistor on. In particular, FIG. 4B illustrates the improved charge characteristics of some embodiments of the present invention over conventional transistors. Curve 401a shows the $Q_{gd}$ at the gate for one embodiment of a transistor according to the present invention (e.g., transistor 300). Curve 401b shows the $Q_{gd}$ for conventional trench-type lateral transistors (e.g., the transistors shown in FIGS. 1A and 1B).

It should be appreciated that the above described values for the various regions of the transistors are merely exemplary and may be chosen to be any suitable values, as the aspects of the invention are not limited in this respect.

Referring back to FIG. 3, transistor 300 may be fabricated using conventional CMOS technology. One exemplary method of fabricating transistor 300 is described below, in accordance with one embodiment of the present invention. The transistor 300 can be an re-channel or p-channel device. The remainder of the description below is limited to examples having n-channels. These examples are non-limiting, and it will be apparent that some embodiments of the invention can be implemented as p-channel devices, or can include both re-channel and p-channel devices.

In one example of an n-channel device, the source region 372 and the drain region 342 have a relatively high n-type doping, while the drift region 343 has a lower n-type concentration, and the channel region 330 has p-type doping. Moreover, the drift region 343 can be formed in an epitaxial layer 348, which, during epitaxial growth, can be provided with a doping type (n-type, in this example) and a doping concentration selected for a desired behavior of the drift region 343.

The transistor 300 may be formed on a substrate layer 390, which can be derived from any suitable substrate. For example, the substrate can be a conventional silicon wafer, or a silicon-on-insulator (SOI) wafer. A p-type silicon substrate layer 390, for example, can have a doping concentration, for example, of about $10^{15}/cm^3$ and a thickness of about 400 µm. A n-type epitaxial layer 348 can have a doping concentration, for example, of about $10^{16}/cm^3$ to about $10^{17}/cm^3$, and can have a thickness, for example, of about 2 µm to about 5 µm. These example thicknesses and concentrations are illustrative. Other suitable values may be used as the aspects of the invention are now limited in this respect.

The epitaxial layer 348 can be formed via any suitable deposition technique. Such techniques include, but are not limited to, atmospheric-pressure CVD (APCVD), low- (or reduced-) pressure CVD (LPCVD), ultra-high-vacuum CVD (UHVCVD), and molecular beam epitaxy. The epitaxial growth system may be a single-wafer or multiple-wafer batch reactor. The growth system also may utilize a low-energy plasma to enhance the layer growth kinetics.

The gate trench 315 and drain trench 345 define a mesa that has an upper portion within which the source region 372 resides. The trenches 315, 345 can be formed by, for example, etching into the epitaxial layer 348. Etching can be performed via any suitable technique, such as reactive ion etching (RIE), sputtering, ion beam, wet chemical etching, etc. For example, RIE can be performed in a $Cl_2/BCl_3$-based plasma using an oxide mask. Prior to etching, the oxide mask layer can be formed by, for example, deposition of oxide via plasma enhanced chemical vapor deposition (PECVD), and patterning at the locations of the gate trench 315 and/or the drain trench 345.

The trenches 315, 345 can be formed in one or more etch steps. For example, a first etch step can define the bottom of the gate trench 315, and a second etch step can define the sidewall on which the gate dielectric layer 360 will be formed by, for example, oxidation or deposition. The depths of the trenches 315, 345 can be any depth suitable to the particular device incorporating the transistor 300. The depth of the gate trench 315 can be, for example, 2 µm. The trenches 315, 345 need not have the same depth. Other depths may be used, as the aspects of the invention are not limited in this respect.

Prior to formation of the gate electrode 310 in the gate trench 315, the gate dielectric layer 360 can be formed on a wall of the trench 315. A sacrificial oxide can first be grown on, and removed from, the sidewall of the trench 315 to improve the quality of the subsequently formed gate dielectric layer 360.

The gate dielectric layer 360 can be, for example, about 1.0 to about 100.0 nm or more in thickness, depending on a desired operating voltage of the transistor 300. The gate dielectric 360 can include any suitable dielectric material, including, for example, silicon dioxide, silicon oxynitride, silicon nitride, multiple layers of silicon nitride and silicon oxide, or a high-k dielectric. For non-high power applications, alternative dielectric materials may be employed to provide a thin effective gate oxide thickness, for example, equivalent to a $SiO_2$ layer thickness of 2.0 nm or less. The gate dielectric layer 360 can be formed via any suitable growth or deposition technique, be of any suitable material and thickness, as the aspects of the invention are not limited in this respect.

Moreover, a dielectric material 365 can be formed at the bottom of the gate trench 360. The material 365 can be thicker than the gate dielectric layer 360 to reduce the gate-to-drain capacitance arising from the overlap of the gate electrode 310 with the drift region 343. The dielectric material 365 beneath the gate electrode 310 can be formed of oxide, for example. The oxide can be formed by any suitable method, for example, the LOCOS method known to those having ordinary skill in the semiconductor device fabrication arts.

The body portion 338 can be formed by any suitable fabrication process, such as those known in the semiconductor device fabrication arts. For example, the body portion 338 can be formed by ion implantation and/or diffusion of a dopant material into a portion of the underlying epitaxial layer 348 to convert a portion of the epitaxial layer 348 into the body portion 338. For example, a p-type dopant can be introduced into an upper portion of a n-type epitaxial layer 348 to convert that portion into a p-type body portion 338. The dopant species can include one or more of any species suitable as a dopant for the semiconductor layer. For example, the dopant species can be B, Al, Ga, and/or In to, for example, convert the body portion 338 from n-type to p-type, and can be P and/or As to, for example, convert the body portion 338 from p-type to n-type.

In some embodiments of the invention, multiple implants are used to help provide a uniform dopant distribution in the body portion 338. For example, a first dose of dopant can be implanted at about 80 keV and a second dose of dopant can be implanted at about 150 keV. Each dose can provide, for example, about $10^{12}/cm^2$ to about $10^{14}/cm^2$ of dopant species. However, other suitable dopant concentrations may be used, as the aspects of the invention are not limited in this respect.

After implantation for the body portion 338, the thermal budget for remaining processing can be limited to avoid an undesirable degree of diffusion of the implanted dopant. For example, it can be desirable to avoid movement of the boundary between the body portion 338 and the epitaxial layer 348 by more than about 0.1 µm to about 0.3 µm. For example, the remaining thermal budget can be equivalent to any one of the following annealing treatments: annealing at about 1050° C. for 30 minutes or less; annealing at about 950° C. for 60 minutes or less; and rapid thermal annealing (RTA) at about 1100° C. for 120 seconds or less. Some annealing, however, after implantation is desirable to active implanted dopant.

The depth of dopant added to form the body portion 338, after any diffusion, defines the boundary between the body portion 338 and the drift region 343. The depth can also determine the length of the channel region 330. Thus, for example, a sub-micrometer channel length can be obtained without reliance on sub-micrometer lithographic capabilities. Alternatively, the body portion 338 can be formed by deposition of a second epitaxial layer on the underlying epitaxial layer 348. The second epitaxial layer can be deposited with a doping type opposite to that of the epitaxial layer 338 to obtain a body portion 338 of the desired doping type.

The drain region 342 resides below and in contact with the drain electrode 340, and is in electrical communication with the drift region 343. The drain region 342 can be formed, for example, via implantation and/or diffusion of dopant into the bottom of the drain trench 345. Implanting can entail implanting one or more doses of one or more suitable dopant species, such as those described above. The dopant species can be implanted at a dose in a range of, for example, about $10^{12}/cm^2$ to about $10^{14}/cm^2$. The source region 372 can be formed of, for example, an n-type dopant. For example, the dopant can be implanted at an energy of about 80 keV and at a dose of about $10^{15}/cm^2$ to about $10^{16}/cm^2$. The above dopant concentrations are merely exemplary, as other dopant concentrations may be used.

The insulating layer 350 is in contact with the drain electrode 340, and disposed between the drain electrode 340 and the channel region 330 to provide electrical isolation for the sides of the drain electrode 340. The insulating layer 350 can be formed of a dielectric material, such as the oxide as described above for the dielectric material 365 formed at the bottom of the gate trench 360. The insulating layer 350 can have a thickness of about 0.5 µm, or less, to a thickness of about 2 µm, or greater. This thickness can be varied as a parameter to vary a breakdown voltage of the transistor 300 as suitable for a particular implementation.

The gate electrode 310, as well as the drain electrode 340, can include, for example, a doped conductive polycrystalline silicon (polysilicon) portion, a silicide portion, and/or portions of other conductive materials. Such materials include, for example, polycrystalline Ge or SiGe, an elemental metal, e.g., titanium (Ti), tungsten (W), molybdenum (Mo), tantalum (Ta), or iridium (Ir), or metal compounds that provide an appropriate workfunction, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$).

In one alternative implementation of the transistor 300, the gate electrode 310 includes a layer of polysilicon deposited along the dielectric layer 360. The polysilicon can be initially deposited as a continuous film extending from within the gate trench 315 over the mesa region next to the trench 315. The polysilicon can be doped with phosphorus, or other dopant, to increase its conductivity. The film can be patterned, and a subsequent RIE etch can be used to remove the polysilicon film on the bottom of the gate trench 315. A conductive material, such as one or a combination of those described above, can then be used to fill the remaining space in the trench 315. Alternatively, the trench 315 can be substantially filled with polysilicon.

When one, or both, of the trenches 315, 345 is entirely filled with polysilicon, polysilicon extending over the surface can be planarized. For example, after deposition of polysilicon, the surface can be planarized via repeated steps of oxidation and etching to remove oxidized material. In this manner, the gate electrode 310 and/or the drain electrode 340 can be formed of polysilicon plugs that are flush with a wafer surface. Metal contacts to the plugs, and additional interconnect, can then be formed in any suitable manner, for example, via fabrication methods known in the semiconductor fabrication arts.

The configuration of the transistor 300, in the plane of a wafer used in fabrication, can be any suitable configuration. For example, as will be understood by one having ordinary skill in the semiconductor fabrication arts, the gate electrode 310 and drain electrode 340 can have interdigitated comb-like shapes to provide a large channel length.

Figure 5:
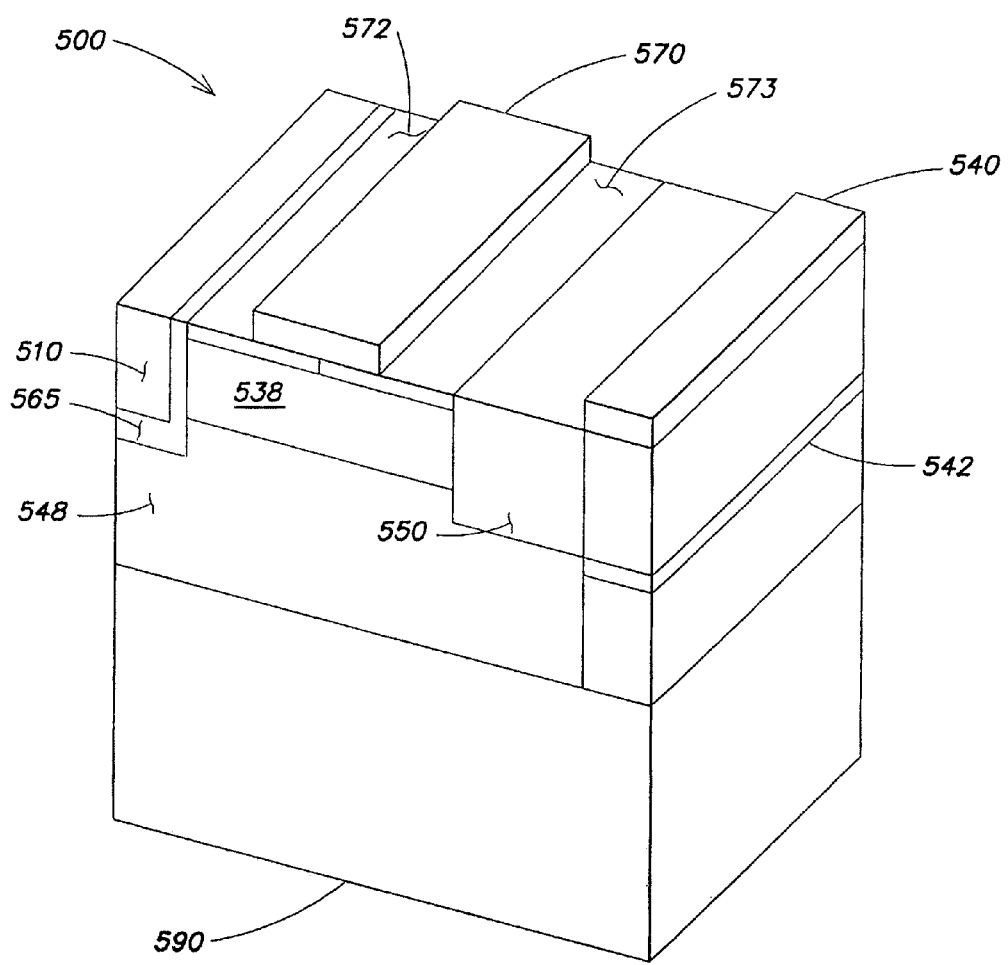
FIG. 5 is a three-dimensional view of a portion of the lateral MOS transistor illustrated in FIG. 2.

FIG. 5 illustrates a top view of a portion of the lateral MOS transistor illustrated in FIG. 3. In particular, FIG. 5 illustrates the first half cell of the semiconductor device illustrated in FIG. 3. Lateral MOS transistor 500 includes a gate region 510 substantially isolated by dielectric layer 565, a source electrode 570 in contact with source region 572 and heavily doped extension 573, and a drain electrode 540 in contact with drain region 242. The lateral MOS transistor is formed on epitaxial layer 548, which is grown on substrate layer 590. The arrangement of lateral MOS transistor 500 is such that the gate and drain structures are spaced apart laterally. Accordingly, parasitic capacitances resulting from an overlap between gate and drain electrodes are reduced or eliminated. The gate trench in which the gate structures are at least partially disposed and the drain trench in which the drain structures are at least partially disposed form a mesa in which the source region is disposed, resulting in improved packing density while still achieving lateral separation of the gate and drain regions.

Figure 6:
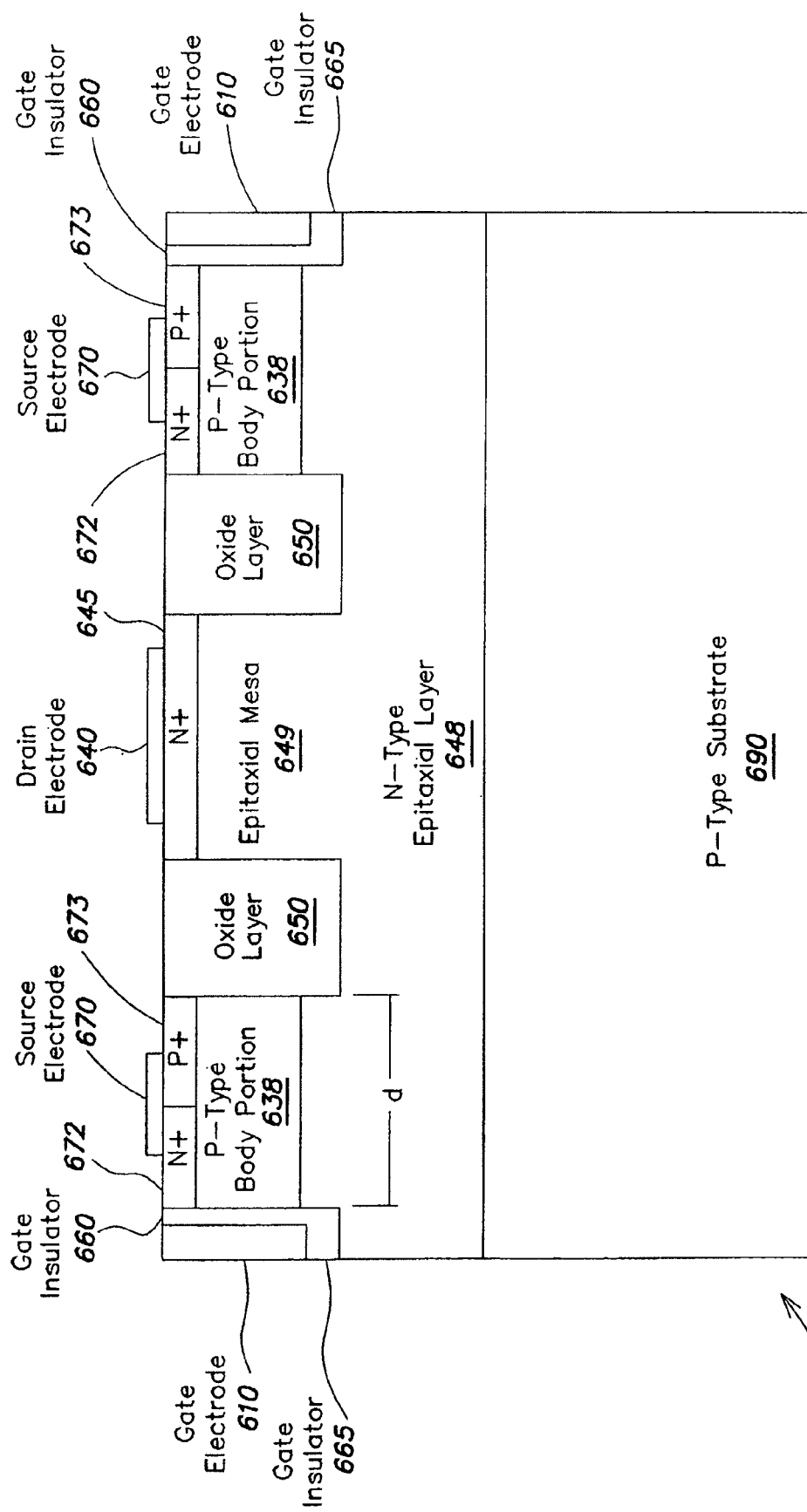
FIG. 6 is a cross-sectional diagram of a portion of a lateral MOS transistor, in accordance with one embodiment of the invention.

FIG. 6 illustrates a lateral MOS transistor in accordance with another embodiment of the present invention. MOS transistor 600 may be similar to transistor 300 illustrated in FIG. 3. However, instead of a drain electrode being, for example, a polysilicon layer disposed within a trench (e.g., drain electrode 340 in FIG. 3), drain electrode 640 is formed on the surface of the device. The extended epitaxial layer 648, therefore, forms an epitaxial mesa 649 (e.g., of single crystal silicon) in between oxide layers 650. The drain region 642, in turn, is provided at the surface substantially at the same level as source region 672.

As one advantage, voltage can be supported in the epitaxial mesa 649. In particular, the drain electrode 340 in FIG. 3 may be made from a relatively heavily doped polysilicon material that cannot support any significant voltage and operates chiefly as a contact layer. Since the epitaxial mesa 649 can support a voltage, the cell can be smaller, reducing the pitch of the lateral transistor. In particular, the same voltage can be supported over a much smaller area. As a result, the lateral distance d can be reduced, which reduces the on-resistance of the transistor and/or improves the packing density of the transistor.

Figure 7:
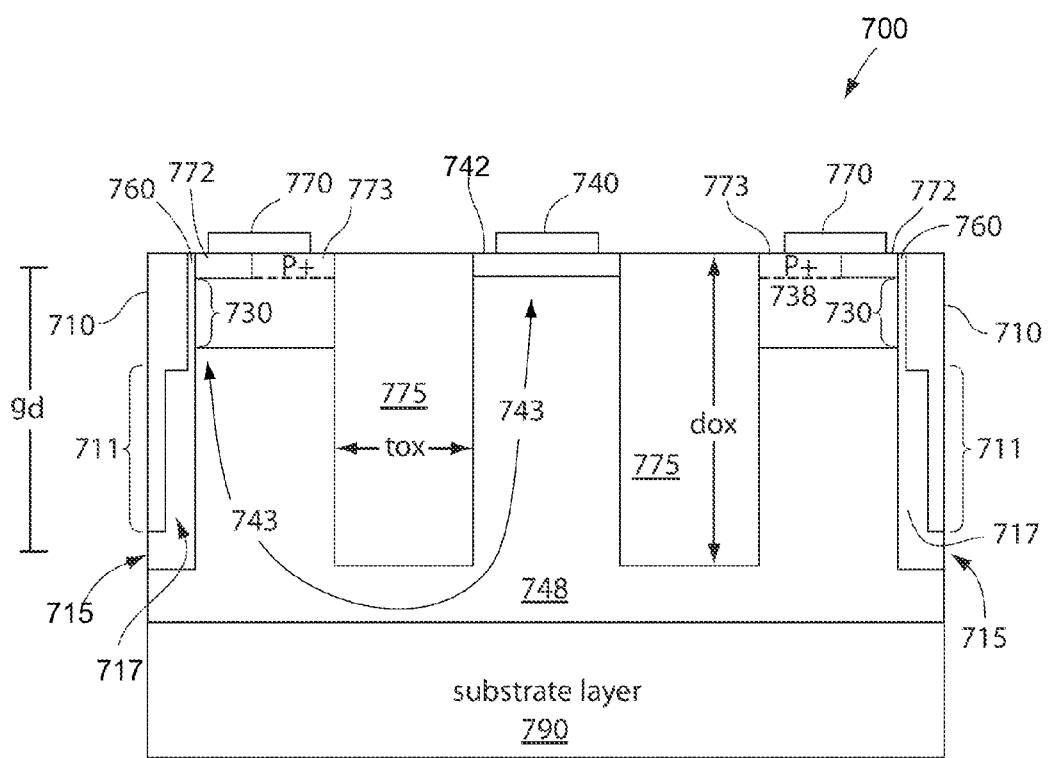
FIG. 7 is a cross-sectional diagram of a portion of an alternative lateral MOS transistor, in accordance with one embodiment of the invention.

Lateral MOS transistor 300 may operate well under some operating conditions, but may also have a practical limit on the source-drain voltage that can be applied before breakdown occurs. An alternative configuration for a lateral MOS transistor may include a field plate as part of, or in addition to, the gate electrode. The field plate may increase the breakdown voltage of the transistor compared to the breakdown voltage of transistor 300. FIG. 7 is a cross-sectional diagram of a portion of a lateral MOS transistor 700 having a field plate in addition to the gate electrode, in accordance with one embodiment of the invention.

It should be appreciated that transistor 700 is a lateral device in the sense that electrical connections to both source and drain regions are made from the top side of a wafer die within which the transistor 700 resides. In contrast, a vertical MOS transistor would typically make contact to a drain region via the backside of a wafer die.

Lateral MOS transistor 700 is similar in some respects to lateral MOS transistor 300 of FIG. 3, and similar numbering is used to indicate similar structures. The lateral MOS transistor 700 includes a substrate layer 790, which in some embodiments may be a p-type substrate. An epitaxial layer 748 is formed on the substrate layer 790. The epitaxial layer 748 constitutes the drift region for the lateral MOS transistor 700, and may be an n-type layer, or have any suitable doping. For purposes of visualization, a path 743 is also illustrated to approximately represent one potential path for current to flow through the drift region when the transistor 700 is on, as described further below. However, as described below, it should be appreciated that the path 743 is only an approximation.

The transistor 700 also includes a body portion 738 which separates a source region 772 (which may be N+ doped or have any other suitable doping), which is in contact with source electrode 770, from the drift region 743 of epitaxial layer 748. The body portion 748 may be a p-type region, or have any other suitable doping. The body portion 738 may be formed in the epitaxial layer, for example by suitable doping of the epitaxial layer, or may be formed on the epitaxial layer using a separate material from that of the epitaxial layer. Similarly, the source region may be formed in or on the epitaxial layer.

The body portion 738 supports a channel region 730, which can become conducting when appropriate bias conditions are applied to the gate electrode 710. The transistor 700 also includes a drain region 742 contacted by a drain electrode 740. As with the body portion and source region, the drain region 742 may be formed in the epitaxial layer (for example, by suitable doping) or on the epitaxial layer using a separate material from that of the epitaxial layer, such as a material deposited or grown on the epitaxial layer. The drain region may be N+ doped, or have any other suitable doping.

The lateral MOS transistor 700 can also include a relatively heavily doped extension 773 of the body portion 738, adjacent to the source region 372. The heavily doped extension 773 can be P+ doped, or have any other suitable doping, and can suppress the turn-on of a parasitic transistor that is inherent in the structure of the transistor 700.

The lateral MOS transistor 700 also includes an oxide spacer region 775, having a width $t_{ox}$ and a depth $d_{ox}$ formed in a trench in the epitaxial layer 748. The drift region, which again is in the epitaxial layer 748, therefore may be considered to be "wrapped" around three sides of the oxide spacer 775. The drift region is roughly illustrated by the path 743 through the epitaxial layer 748. However, it should be appreciated that because the drift region may actually be "wrapped" around three sides of the oxide spacer 775, the drift region may actually be formed in the third dimension of the chip (i.e., into and out of the page of FIG. 7) around the oxide spacer region 775, which may result in reduced cell pitch compared to other configurations of lateral MOS transistors.

The dimensions of the oxide spacer region 775 may be selected to provide desired operating characteristics, such as to control the length of the drift region. For example, the width $t_{ox}$ may be approximately 2.5 microns, or have any other suitable value, as the lateral MOS transistors described herein are not limited to any particular value for the width of the oxide spacer region. Similarly, the depth $d_{ox}$ may be approximately 7 microns, or have any other suitable value. In some embodiments, the depth $d_{ox}$ of the oxide spacer region is approximately equal to the depth $g_d$ of the gate trench 715, in which the gate 710 is formed, as described further below.

As mentioned, lateral MOS transistor 700 also includes a gate electrode 710 formed in a gate trench 715, that is used to apply a gate voltage to mediate current flowing between the source region 772 and the drift region through the channel region 730. The gate trench 715 has a depth $g_d$. A field plate 711 is also formed in the gate trench 715, and may be formed of the same material as the gate electrode 710, or any other suitable material. The gate electrode 710, as well as the field plate 711, can include, for example, a doped conductive polycrystalline silicon (polysilicon) portion, a silicide portion, and/or portions of other conductive materials. Such materials include, for example, polycrystalline Ge or SiGe, an elemental metal, e.g., titanium (Ti), tungsten (W), molybdenum (Mo), tantalum (Ta), or iridium (Ir), or metal compounds that provide an appropriate workfunction, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$).

The field plate 711 can be an extension of the gate electrode 310, and therefore may contact the gate electrode 310, or may be distinct from the gate electrode, as the lateral MOS transistors described herein are not limited in this respect. The field plate 711 may have any suitable dimensions. For example, as shown, the thickness of the field plate 711 is smaller than the thickness of the gate electrode 710. The depth of the field plate is greater than the depth of the gate electrode, and is sufficiently long that the field plate 711 is in close proximity to the bottom of the gate trench 715. However, it should be appreciated that the exact dimensions of the field plate are not limiting.

The gate trench 715 is filled with dielectric. The gate dielectric layer 760 separates the gate electrode 710 from the source region 772 and the body region 738, and has a substantially vertical orientation. This vertical orientation can provide a smaller device lateral footprint for the transistor. A thicker dielectric region 717, which may be an oxide or any other suitable dielectric, separates the field plate 711 from the epitaxial layer 748, and therefore from the drift region.

During operation of the transistor 700, when a positive bias voltage greater than the threshold voltage of the transistor 700 is applied to the gate electrode 710, an inversion layer of electrons forms in the channel region 730, adjacent to the sidewall of gate trench 715. Electrons flow from the n⁺ doped source region 772, through the channel region 730 and the drift region 743 (although it is again noted that the drift region may additionally, or alternatively, include a path in the third dimension of the chip, i.e., into and out of the page of FIG. 7, around the oxide spacer 775) of the epitaxial layer 748, to the n⁺ doped drain region 742, and are collected by the drain electrode 740.

Figure 8:
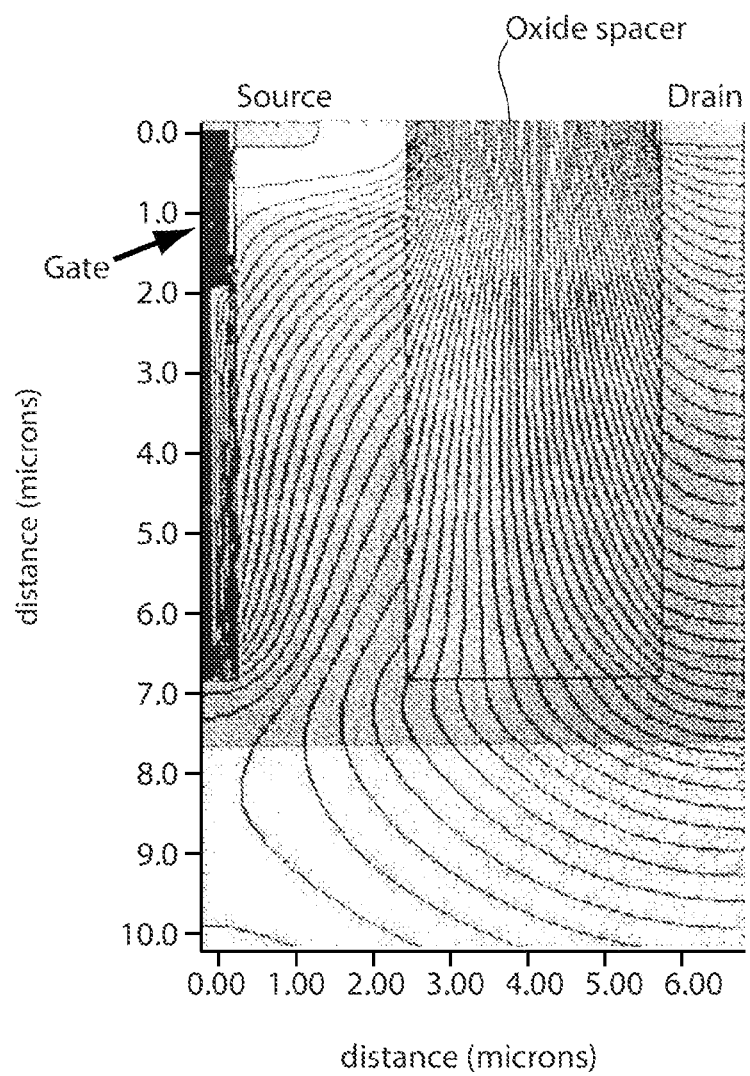
FIG. 8 is a simulation of equi-potential lines in the transistor of FIG. 7.

As mentioned, the field plate 711 may increase the breakdown voltage of the lateral MOS transistor 700 compared to the breakdown voltage of other lateral MOS transistors, such as transistor 300 in FIG. 3. FIG. 8 illustrates simulated equi-potential lines in the off state of transistor 700 for an applied source-drain voltage of 250V. The x-axis represents distance in the x-direction, in units of microns. Similarly, the y-axis represents distance in the y-direction in units of microns.

The field plate 711 may reduce the electric field, and shape the equi-potential lines in the region between the gate electrode and the oxide spacer region and the drain region. The breakdown voltage of the structure may thus be increased relative to that of other lateral MOS transistor configurations. For example, the breakdown voltage of the structure may be approximately 250V or greater.

In addition, the configuration of the transistor 700 may also have low specific-on-resistance. The cell-pitch of the structure in FIG. 7 may be approximately 5 microns, despite having a drift region length of approximately 16 microns in some embodiments. The low cell-pitch can lead to improved packing density and therefore reduced specific-on-resistance. In some embodiments, the specific-on-resistance may be approximately 4.5 mOhm-cm² (e.g., 4.6 mOhm-cm²) with a breakdown voltage of approximately 250V.

It should be appreciated that transistor 700 is one non-limiting example of a lateral MOS transistor implementing a field plate. Other configurations, and other device parameters (e.g., gate trench depth, oxide spacer region width and depth, etc.) are possible. Furthermore, while transistor 700 is described as being an n-channel transistor, it should be appreciated that it could alternatively be a p-channel transistor by suitably altering the doping types of the various layers/regions.

It should also be appreciated that the transistor 700 may be manufactured in any suitable manner. For example, the transistor 700 may be manufactured using conventional CMOS technology, and any suitable order of processing steps. For example, the method may comprise forming the epitaxial layer on the substrate. The gate trench may be formed and then at least partially filled with dielectric material. The gate electrode and field plate may be formed in the dielectric material in the gate trench.

The body portion, source region, and drain region may be formed by suitable doping of the epitaxial layer, for example. The oxide spacer region may be formed by first forming a trench in the epitaxial layer and then filling the trench with an oxide material. As mentioned, in some embodiments, the oxide spacer region may have a depth approximately equal to a depth of the gate trench. The source and drain electrodes may then be formed, for example by deposition of suitable contact materials.

It should be appreciated that other methods of manufacture of the structure of FIG. 7 are also possible, and the various aspects of the invention are not limited to any particular method of manufacture.

This invention is not limited in its application to the details of the fabrication processes, and the construction and the arrangement of components set forth in the description herein or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. For example, devices, according to the invention, can have a variety of sizes and shapes of structural features, and can utilize any suitable semiconductor materials formed from elemental, alloy, and/or compound semiconductors. Such semiconductor materials include, but are not limited to Si, Ge, a material that includes at least two group III and V elements, such as gallium arsenide, indium gallium arsenide, indium gallium phosphide, and gallium arsenide, or from a semiconductor that includes at least two group II and VI elements, such as zinc selenide, sulphur, cadmium telluride, and mercury telluride. Such alterations, modifications, and improvements are intended to be part of this disclosure, and are intended to be within the spirit and scope of the invention. Accordingly, the foregoing description and drawings are by way of example only.

What is claimed is:

1. An apparatus comprising:
   a semiconductor substrate;
   an epitaxial layer disposed on the semiconductor substrate and configured to provide a drift region;
   a body portion contacting the drift region and configured to provide a channel for current flow when a bias signal is applied to a gate electrode;
   a source region contacting the body portion;
   a gate trench formed in the epitaxial layer;
   the gate electrode formed at least partially in the gate trench and extending to a first depth in the gate trench;
   a field plate formed at least partially in the gate trench and extending to a second depth, greater than the first depth, in the gate trench; and
   a dielectric material comprising a first portion disposed in the gate trench between the gate electrode and the source region and a second portion disposed in the gate trench between the field plate and the epitaxial layer.

2. The apparatus of claim 1, further comprising a drain region contacting the drift region and configured to be in electrical connection with the source region when the bias signal is applied to the gate electrode.

3. The apparatus of claim 2, wherein the drift region is formed in the epitaxial layer so that current flows from the source region to the drain region through the channel region and the drift region when the bias signal is applied to the gate electrode.

4. The apparatus of claim 2, further comprising a spacer region formed in a trench in the epitaxial layer and disposed between the source region and the drain region.

5. The apparatus of claim 4, wherein the spacer region has a depth substantially equal to a depth of the gate trench.

6. The apparatus of claim 4, wherein the spacer region comprises an oxide material.

7. The apparatus of claim 4, wherein the spacer region is substantially surrounded on three sides by the epitaxial layer.

8. The apparatus of claim 1, wherein the gate electrode and the field plate comprise polysilicon.

9. The apparatus of claim 1, wherein the gate electrode contacts the field plate.

10. The apparatus of claim 1, wherein the first portion of the dielectric material in the gate trench has a first thickness, and wherein the second portion of the dielectric material disposed between the field plate and the epitaxial layer has a second thickness greater than the first thickness.

11. A method of manufacturing a lateral trench-based device, comprising:
    forming an epitaxial layer on a semiconductor substrate;
    forming a gate trench in the epitaxial layer;
    filling at least a portion of the gate trench with a dielectric material;
    forming a gate electrode in the dielectric material, the gate electrode extending to a first depth in the gate trench; and
    forming a field plate in the dielectric material, the field plate extending to a second depth, greater than the first depth, in the gate trench.

12. The method of claim 11, further comprising forming the gate electrode to contact the field plate.

13. The method of claim 11, further comprising forming a source region in the epitaxial layer and a drain region in the epitaxial layer, and forming an oxide spacer region between the source region and the drain region.

14. The method of claim 13, wherein forming the oxide trench comprises forming a trench in the epitaxial layer and filling at least a portion of the trench with an oxide material.

* * * * *

UNITED STATES PATENT AND TRADEMARK OFFICE
CERTIFICATE OF CORRECTION

| | | |
|---|---|---|
| PATENT NO. | : 8,159,024 B2 | Page 1 of 1 |
| APPLICATION NO. | : 12/596593 | |
| DATED | : April 17, 2012 | |
| INVENTOR(S) | : Tat-sing Paul Chow et al. | |

It is certified that error appears in the above-identified patent and that said Letters Patent is hereby corrected as shown below:

At column 1, line 54, "...FIGS. 1A..." should read --FIG 1A--.

At column 7, line 14, "re-channel" should read --n-channel--.

At column 7, line 19, "re-channel" should read --n-channel--.

Signed and Sealed this
Fifth Day of June, 2012

David J. Kappos
*Director of the United States Patent and Trademark Office*